(12) United States Patent
Devendorf et al.

(10) Patent No.: US 7,253,689 B2
(45) Date of Patent: Aug. 7, 2007

(54) LOW DISTORTION AMPLIFIER

(75) Inventors: Don C. Devendorf, Carlsbad, CA (US);
Lloyd F. Linder, Agoura Hills, CA (US); Cuong D. Tran, Garden Grove, CA (US)

(73) Assignee: Telasic Communications, Inc., El Segundo, CA (US)

( * ) Notice: Subject to any disclaimer, the term of this patent is extended or adjusted under 35 U.S.C. 154(b) by 93 days.

(21) Appl. No.: 11/148,683

(22) Filed: Jun. 8, 2005

(65) Prior Publication Data
US 2005/0270107 A1 Dec. 8, 2005

Related U.S. Application Data

(60) Provisional application No. 60/577,974, filed on Jun. 8, 2004.

(51) Int. Cl.
*H03F 3/04* (2006.01)
(52) U.S. Cl. .................. 330/311; 330/310
(58) Field of Classification Search ........... 330/310, 330/311, 98, 150, 82, 85
See application file for complete search history.

(56) References Cited

U.S. PATENT DOCUMENTS

| | | | | |
|---|---|---|---|---|
| 3,753,121 A * | 8/1973 | Hilbert | ................. | 455/341 |
| 3,934,209 A * | 1/1976 | Valentine et al. | ........... | 330/295 |
| 4,355,344 A * | 10/1982 | Felici et al. | ................. | 361/103 |
| 4,409,560 A * | 10/1983 | Davis | ................. | 330/296 |
| 5,859,568 A * | 1/1999 | Le et al. | ................. | 330/289 |
| 6,584,196 B1 * | 6/2003 | Sacca et al. | ................. | 379/405 |

* cited by examiner

*Primary Examiner*—Henry Choe
(74) *Attorney, Agent, or Firm*—Christie, Parker & Hale, LLP.

(57) ABSTRACT

A low distortion amplifier. The novel amplifier includes a first transistor Q1 having first and second output terminals and an input terminal adapted to receive an input signal, and a second transistor Q2 having first and second output terminals and an input terminal adapted to receive a signal from the first output terminal of Q1, wherein the second output terminal of Q1 is connected to the second output terminal of Q2 in order to eliminate a nonlinear current component in Q2. In an illustrative embodiment, the amplifier also includes a cascode Darlington pair Q3, Q4 for holding the second output terminals of Q1 and Q2 at a desired voltage to further reduce distortion and to maintain a wide bandwidth.

32 Claims, 3 Drawing Sheets

LOW DISTORTION AMPLIFIER

CROSS-REFERENCE TO RELATED APPLICATIONS

This application claims the benefit of U.S. Provisional Application No. 60/577,974, filed Jun. 8, 2004, the disclosure of which is hereby incorporated by reference.

BACKGROUND OF THE INVENTION

1. Field of the Invention

The present invention relates to electronics. More specifically, the present invention relates to amplifiers.

2. Description of the Related Art

High dynamic range, low distortion, wideband amplifiers (or gain blocks) are used in a myriad of applications such as communications, high quality audio and video, electronic warfare, and radar systems. Many of these applications require amplifiers having very high performance (low distortion), wide bandwidth, and low power dissipation.

Modem communications systems, with the advent of high speed, low distortion analog to digital converters, tend to sample at IF (intermediate frequency) or RF (radio frequency). This allows all subsequent processing (demodulation, filtering, etc.) to be performed in the digital domain. As the ratio of information bandwidth to carrier frequency increases, it becomes increasingly difficult to maintain the linearity required. In particular, conventional amplifiers do not meet the linearity requirements for these types of applications.

The high power dissipation characteristics of conventional amplifiers require the circuit designer to increase system power or narrow the information bandwidth of each channel, thereby requiring more channels to be used, to meet systems linearity requirements.

Hence, there is a need in the art for an improved wideband amplifier offering lower distortion and lower power dissipation than prior art approaches.

SUMMARY OF THE INVENTION

The need in the art is addressed by the low distortion amplifier of the present invention. The novel amplifier includes a first transistor Q1 having first and second output terminals and an input terminal adapted to receive an input signal, and a second transistor Q2 having first and second output terminals and an input terminal adapted to receive a signal from the first output terminal of Q1, wherein the second output terminal of Q1 is connected to the second output terminal of Q2 in order to eliminate a nonlinear current component in Q2. In an illustrative embodiment, the amplifier also includes a cascode Darlington pair Q3, Q4 for holding the second output terminals of Q1 and Q2 at a desired voltage to further reduce distortion and to maintain a wide bandwidth. In one embodiment, the amplifier also includes a first feedback loop with an operational amplifier to minimize the amplifier's overall distortion products, and a second feedback loop to set the input and output impedances of the amplifier.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
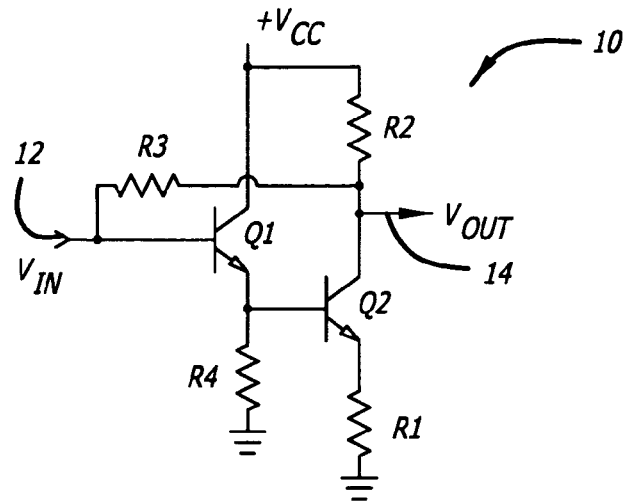
FIG. 1 is a simplified schematic of a conventional amplifier having low input and output impedances.

FIG. 1 is a simplified schematic of a conventional amplifier 10 having low input and output impedances. The amplifier 10 includes a Darlington pair comprised of two transistors Q1 and Q2. An input voltage $V_{IN}$ is applied to an input terminal 12 connected to the base of Q1. An output voltage $V_{OUT}$ is taken at an output terminal 14 connected to the collector of Q2. The emitter of Q2 is connected to ground through a resistor R1, and the collector of Q2 is connected to a supply voltage $V_{CC}$ through a resistor R2. The emitter of Q1 is connected to the base of Q2 and to ground through a resistor R4. The collector of Q1 is connected to $V_{CC}$. The input terminal 12 is connected to the output terminal 14 by a resistor R3.

IF and RF systems typically require matched impedances (50 ohm). The prior art amplifier implementation of FIG. 1 can be designed to have low (50 ohm) input and output impedances, but exhibits high distortion. The distortion can be reduced by increasing the current in Q2, but this approach leads to high power dissipation. For reasonable power levels, the third order output intercept (OIP3) tends to be low (<30 dB).

Figure 2:
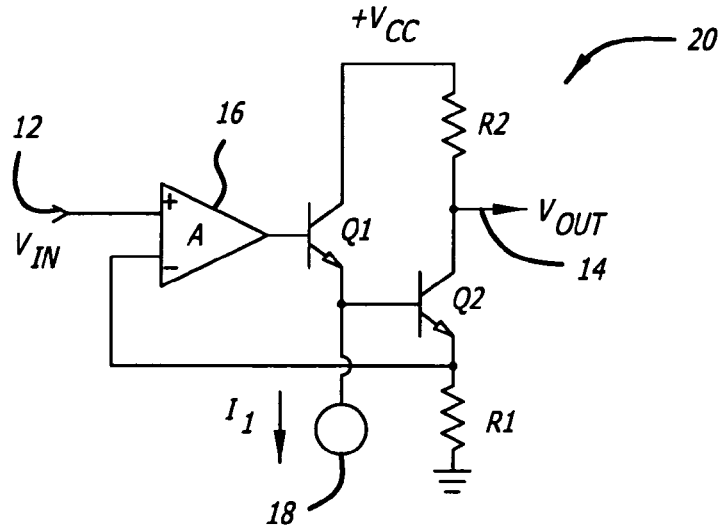
FIG. 2 is a simplified schematic of a conventional high input impedance, low distortion amplifier.

A second prior art implementation is shown in FIG. 2. FIG. 2 is a simplified schematic of a conventional high input impedance, low distortion amplifier 20. The amplifier 20 includes a Darlington pair comprised of two transistors Q1 and Q2, plus an operational amplifier (op amp) 16 having gain A. The input voltage $V_{IN}$ is applied to an input terminal 12 connected to the positive input terminal of the op amp 16. The output of the op amp 16 is connected to the base of Q1. The emitter of Q1 is connected to the base of Q2 and to a current source 18. The collector of Q1 is connected to $V_{CC}$. The emitter of Q2 is connected to the negative input terminal of the op amp 16 and to ground through a resistor R1. The collector of Q2 is connected to $V_{CC}$ through a resistor R2.

The output voltage $V_{OUT}$ is taken at an output terminal 14 connected to the collector of Q2.

This circuit has a high input impedance and the distortion is reduced by the loop gain of the op amp 16. While this circuit can provide reasonable OIP3 for reasonable power dissipation, it is not suitable for use in a 50 ohm system.

Figure 3:
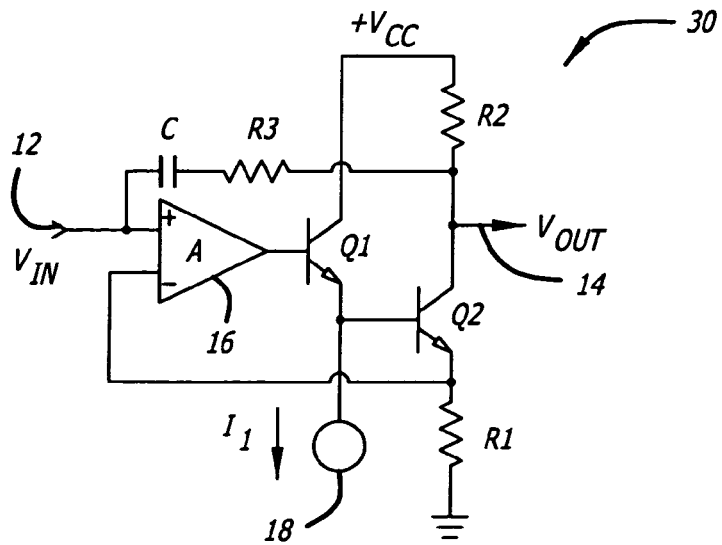
FIG. 3 is a simplified schematic of a low impedance, low distortion amplifier that combines the approaches of the previous two circuits.

FIG. 3 is a simplified schematic of a low impedance, low distortion amplifier 30 that combines the approaches of the previous two circuits. The amplifier 30 includes a Darlington pair comprised of two transistors Q1 and Q2, plus an op amp 16. The input voltage $V_{IN}$ is applied to an input terminal 12 connected to the positive input terminal of the op amp 16. The output of the op amp 16 is connected to the base of Q1. The emitter of Q1 is connected to the base of Q2 and to a current source 18. The collector of Q1 is connected to $V_{CC}$. The emitter of Q2 is connected to the negative input terminal of the op amp 16 and to ground through a resistor R1. The collector of Q2 is connected to $V_{CC}$ through a resistor R2. The output voltage $V_{OUT}$ is taken at an output terminal 14 connected to the collector of Q2. The input terminal 12 is connected to the output terminal 14 by a capacitor C connected in series with a resistor R3.

Figure 4:
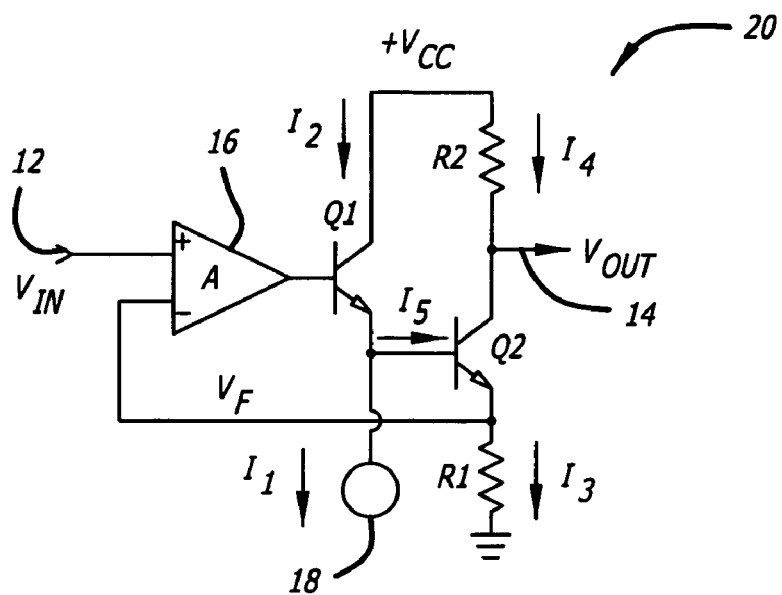
FIG. 4 is a simplified schematic of a conventional amplifier showing the current flows in the circuit.

In this approach, the input and output impedances can be set to equal 50 ohms, thereby allowing this circuit to be used in a 50 ohm system. The OIP3 is still reasonable as is the power level. Unfortunately the OIP3 is, in general, below +40 dBm in this circuit configuration as a result of the nonlinear base current contribution in Q2. FIG. 4 illustrates why the distortion is still higher than desired even though the gain A of the op amp 16 might be large.

FIG. 4 is a simplified schematic of a conventional amplifier 20 showing the current flows in the circuit. The current provided by the current source 18 is labeled $I_1$. The current going into the collector of Q1 is labeled $I_2$. The current flowing out of the emitter of Q2 through R1 is labeled $I_3$. The current going into the collector of Q2 through R2 is labeled $I_4$. The current flowing into the base of Q2 is labeled $I_5$. The voltage at the emitter of Q2 is labeled $V_F$.

The voltage $V_F$ is almost a perfect (linear) representation of the input voltage $V_{IN}$ if the gain A of the op amp 16 is large. Therefore, $I_3$ is also a perfect (linear) representation of the input. The problem arises in that $I_4$, which is the current that sets the output $V_{OUT}$, is shown to be: $I_4=I_3-I_5$. Now, $I_5$ has a component that is not a linear function of the input voltage $V_{IN}$. This nonlinearity is due in part to the Early effect which cannot be eliminated in this circuit configuration. The Early effect results in a nonlinear base current. Also, the current gain of the transistor Q2 is a non-linear function of the signal current in Q2. This results in a second source of non-linear base signal current in Q2. Since $I_5$ varies in a nonlinear fashion, so will $I_4$ since it has $I_5$ as a component. This results in distortion in the output $V_{OUT}$.

The present invention eliminates this problem by using a novel method to cancel the nonlinear base currents that exist in the output Darlington pair. The novel current routing for the Darlington pair is shown in FIG. 5.

Figure 5:
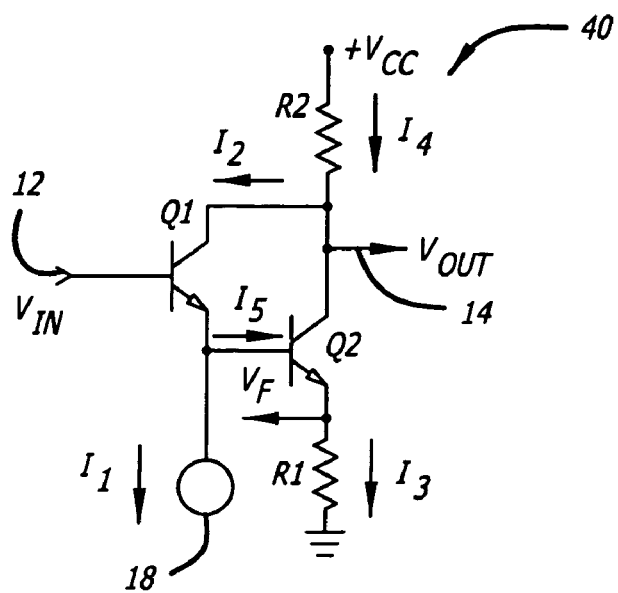
FIG. 5 is a simplified schematic of an illustrative amplifier designed in accordance with the teachings of the present invention.

FIG. 5 is a simplified schematic of an illustrative amplifier 40 designed in accordance with the teachings of the present invention. The amplifier 40 includes a Darlington pair comprised of two transistors Q1 and Q2. The input voltage $V_{IN}$ is applied to an input terminal 12 connected to the base of Q1. The emitter of Q1 is connected to the base of Q2 and to a current source 18. The emitter of Q2 is connected to ground through a resistor R1. The collector of Q2 is connected to $V_{CC}$ through a resistor R2. The output voltage $V_{out}$ is taken at an output terminal 14 connected to the collector of Q2. In accordance with the teachings of the present invention, the collector of Q1 is connected to the collector of Q2, instead of to $V_{CC}$ as in conventional approaches.

The current provided by the current source 18 is labeled $I_1$. The current going into the collector of Q1 is labeled $I_2$. The current flowing out of the emitter of Q2 through R1 is labeled $I_3$. The current flowing through R2 is labeled $I_4$. The current flowing into the base of Q2 is labeled $I_5$. The voltage at the emitter of Q2 is labeled $V_F$.

By tying the collector of Q1 to the output, the current $I_4$ is equal to: $I_4=I_3-I_5+I_2$. The current $I_2$ is given by: $I_2=I_1+I_5$. Substituting for $I_2$ in the equation for $I_4$ results in: $I_4=I_3-I_5+I_1+I_5$, or $I_4=I_3+I_1$. The nonlinear current $I_5$ has been cancelled out and replaced with $I_1$ which is a constant. This allows the amplifier to have a much higher OIP3 than conventional amplifier implementations. In this configuration, the nonlinear base current error in Q2 is circulated and is now replaced by the nonlinear base current error in Q1 in response to Q2's nonlinear base current. Therefore, the original error in Q2 is reduced by a factor of β, which is 80 to 100.

This approach can be used in a dual loop configuration to create a 50 ohm wideband amplifier that exhibits extremely low distortion products (OIP3 greater that +50 dBm) at DC power levels less than 0.5 watts.

Figure 6:
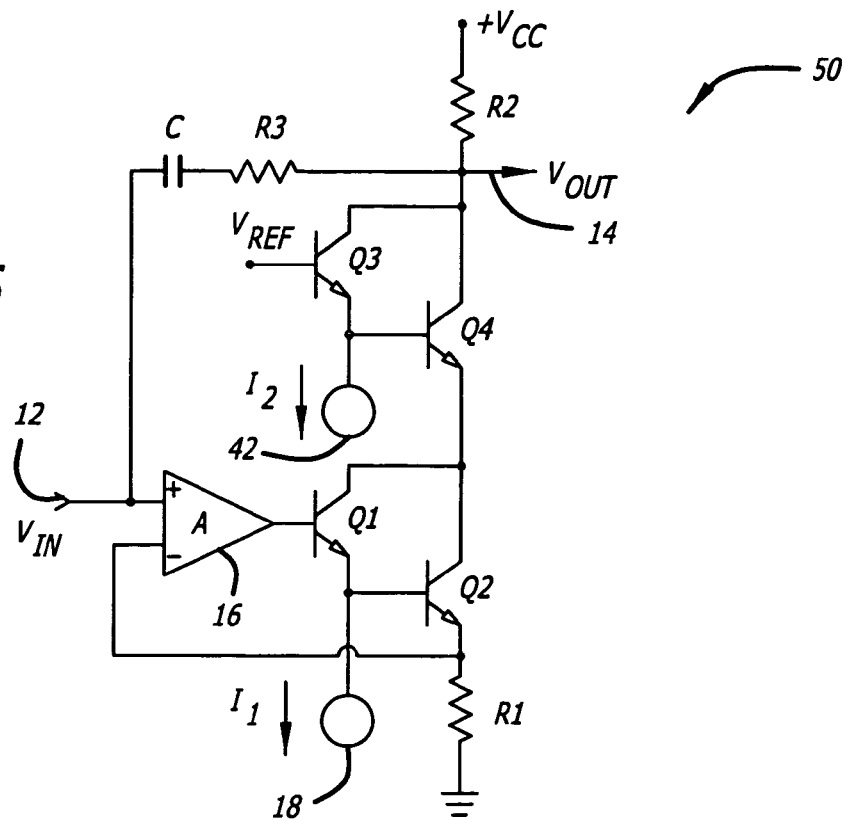
FIG. 6 is a simplified schematic of a low input/output impedance, low distortion RF amplifier designed in accordance with the teachings of the present invention.

FIG. 6 is a simplified schematic of a low input/output impedance, low distortion RF amplifier 50 designed in accordance with the teachings of the present invention. The amplifier 50 includes a Darlington pair comprised of two transistors Q1 and Q2, and an op amp 16. The input voltage $V_{IN}$ is applied to an input terminal 12 connected to the positive input terminal of the op amp 16. The output of the op amp 16 is connected to the base of Q1. The emitter of Q1 is connected to the base of Q2 and to a current source 18 that provides a current $I_1$. The emitter of Q2 is connected to the negative input terminal of the op amp 16 and to ground through a resistor R1. As described above, the collector of Q1 is connected to the collector of Q2 to eliminate the nonlinear component of Q2's base current.

In accordance with the teachings of the present invention, the amplifier 50 also includes a cascode Darlington pair comprised of two transistors Q3 and Q4, added between the collectors of Q1 and Q2, and the output terminal 14. The base of Q3 is connected to a reference voltage $V_{REF}$, and the emitter of Q3 is connected to the base of Q4 and to a current source 42 that provides a current $I_2$. The emitter of Q4 is connected to the collectors of Q1 and Q2, and the collector of Q4 is connected to $V_{CC}$ through a resistor R2. The collector of Q3 is connected to the collector of Q4. Thus, the cascode pair Q3, Q4 utilizes the same configuration previously described to eliminate the variable component of Q4's base current. The output voltage $V_{OUT}$ is taken at the output terminal 14 connected to the collectors of Q3 and Q4, and the input terminal 12 is connected to the output terminal 14 by a capacitor C connected in series with a resistor R3.

The cascode provides additional benefits to the circuit. First, it reduces the distortion due to the Early effect by holding the collectors of Q1 and Q2 at a constant voltage ($V_{REF}-V_{BEQ3}-V_{BEQ4}$, where $V_{BEQ3}$ is the base to emitter voltage of Q3 and $V_{BEQ4}$ is the base to emitter voltage of Q4). It also improves the frequency response of the circuit by providing a low impedance at the collectors of Q1 and Q2. It therefore allows Q1 and Q2 to be implemented with transistors that have a very high transition frequency $f_t$. In silicon bipolar and silicon germanium technology, devices with high $f_t$ have low breakdown voltages. Since $V_{OUT}$ will swing over a 4 volt range, the transistors attached to $V_{OUT}$ must have high breakdown. By using Q3 and Q4 in a common base configuration (the effective $f_t$ of this configuration is very high), Q3 and Q4 can be implemented using devices that have a higher breakdown voltage than Q1 and Q2 at the expense of $f_t$. However, since Q3 and Q4 are configured as a current amplifier, the effective bandwidth of the cascode is close to the $f_t$ of the high breakdown device, which is sufficient. This circuit approach allows the transistors in the signal path at the input stage to be low breakdown, high $f_t$ devices. The output, which requires a high voltage swing, can utilize high breakdown, low $f_t$ devices to handle the voltage swing while continuing to maintain a wide bandwidth. If additional headroom is required (to achieve a 4 volt swing on the output) a choke can be substituted for R2.

Illustrative values for the components of the amplifier 50 of FIG. 6 are shown in the following table:

| Illustrative Values for Devices in FIG. 6 | |
|---|---|
| R1 | 5 Ω |
| R2 | 50 Ω |
| R3 | 550 Ω |
| C | 20 picoFarads |
| $I_1$ | 2 mA |
| $I_2$ | 2 mA |

Thus, the novel amplifier 50 of the present invention utilizes a configuration that employs two separate feedback loops. One loop is used to set the input impedance and output impedance of the amplifier, and a second independent loop is used to minimize the amplifier's overall distortion products. A novel Darlington pair configuration is used to eliminate distortion arising from the nonlinear base current. In addition, a cascode Darlington pair is added to further reduce distortion and to maintain a wide bandwidth.

This topology allows higher OIP3 (10× improvement) at lower DC power (2-5×) at lower supply voltages (2-3×) over existing products on the market. The amplifier can be configured for standard 50 ohm input and 50 ohm output, 20 dB gain, a third order output intercept greater than +50 dBm, and power dissipation less than 0.5 watts. Prior art amplifiers with similar bandwidth (10 MHz-3 GHz), gain, and pulse performance tend to have third order output intercepts less than +37 dBm at similar power levels as the described invention. The circuit can also perform with a power supply voltage of +5V where prior art amplifiers that operate with +5 V supplies have been limited to +40 dBm third order OIP3 performance.

Because of this amplifier's excellent linearity, it can be used in applications where direct sampling of IF or RF waveforms is desired. The low power requirements of the amplifier allow it to be used in multi-channel applications as well as applications where low power, low distortion and small size are important parameters.

Figure 7:
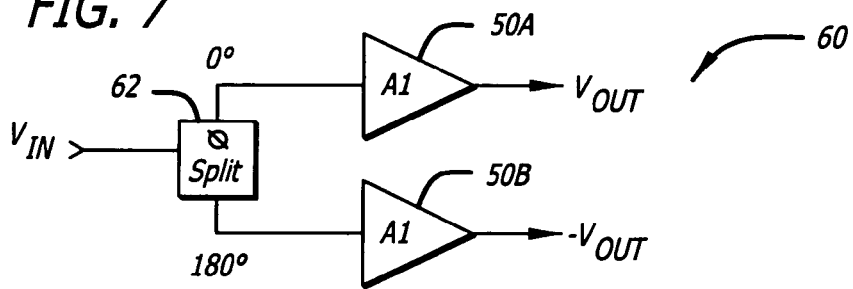
FIG. 7 is a simplified schematic of an amplifier with a differential configuration designed in accordance with the teachings of the present invention.

The teachings of the present invention can also be applied to a differential configuration. FIG. 7 is a simplified schematic of an amplifier 60 with a differential configuration designed in accordance with the teachings of the present invention. The amplifier 60 employs a phase splitter 62, which receives an input signal $V_{IN}$ and provides two output signals differing in phase by 180°. The first output of the phase splitter is amplified by an amplifier 50A to generate an output signal $V_{OUT}$, and the second output of the phase splitter is amplified by an amplifier 50B to generate a signal $-V_{OUT}$. The amplifiers 50A and 50B are each implemented using the configuration of FIG. 6.

Figure 8:
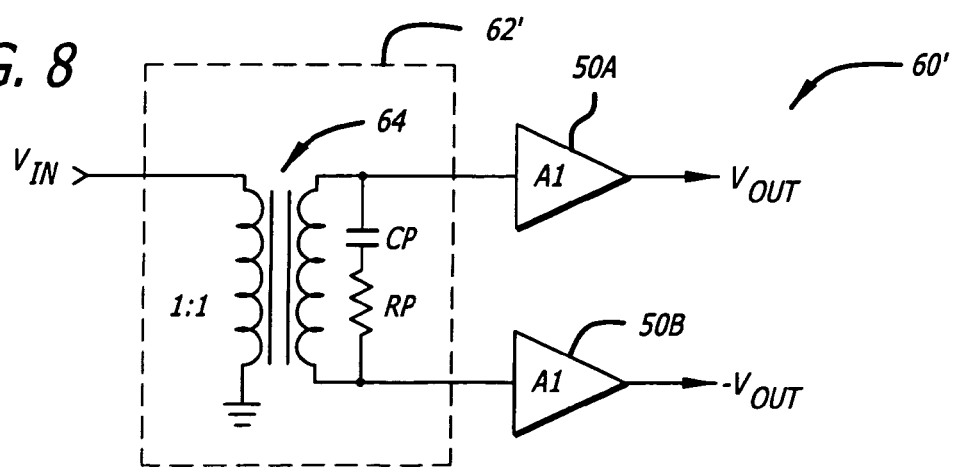
FIG. 8 is a simplified schematic of an amplifier with a differential configuration designed in accordance with the teachings of the present invention.

FIG. 8 is a simplified schematic of an amplifier 60' with a differential configuration designed in accordance with the teachings of the present invention. FIG. 8 shows one possible implementation of a phase splitter 62'. The phase splitter 62' includes a transformer 64 connected in parallel to a capacitor $C_P$ and a resistor $R_P$ in series.

A differential configuration increases the OIP3 by 6 dB over the single ended performance (to +56 dBm) while increasing the power only by a factor of two. The performance potential of this configuration represents a significant improvement over commercially available devices currently advertised in the marketplace.

Thus, the present invention has been described herein with reference to a particular embodiment for a particular application. Those having ordinary skill in the art and access to the present teachings will recognize additional modifications, applications and embodiments within the scope thereof. For example, while the illustrative embodiments have been described using NPN bipolar transistors, other process technologies may be used without departing from the scope of the present teachings.

It is therefore intended by the appended claims to cover any and all such applications, modifications and embodiments within the scope of the present invention.

Accordingly,

What is claimed is:

1. An amplifier comprising:
    a first transistor Q1 having first and second output terminals and an input terminal adapted to receive an input signal;
    a constant current source coupled to said first output terminal of Q1; and
    a second transistor Q2 having first and second output terminals and an input terminal adapted to receive a signal from said first output terminal of Q1, wherein said second output terminal of Q1 is connected to said second output terminal of Q2.

2. The invention of claim 1 wherein said amplifier further includes a resistor R1 connected between said first output terminal of Q2 and ground.

3. The invention of claim 1 wherein said amplifier further includes a resistor R2 connected between said second output terminal of Q2 and a supply voltage VCC.

4. The invention of claim 1 wherein said input terminal of Q1 is the base of Q1, the first output terminal of Q1 is the emitter of Q1, and the second output terminal of Q1 is the collector of Q1.

5. The invention of claim 1 wherein said input terminal of Q2 is the base of Q2, the first output terminal of Q2 is the emitter of Q2, and the second output terminal of Q2 is the collector of Q2.

6. The invention of claim 1 wherein said amplifier further includes an operational amplifier adapted to receive an input signal and output a signal to said input terminal of Q1.

7. The invention of claim 6 wherein said first output terminal of Q2 is coupled to a negative input terminal of said operational amplifier.

8. The invention of claim 7 wherein said input signal is applied to a positive input terminal of said operational amplifier.

9. The invention of claim 8 wherein said amplifier further includes an input terminal for receiving an input signal connected to said positive input terminal of said operational amplifier.

10. The invention of claim 9 wherein said amplifier further includes an output terminal coupled to said second output terminal of Q2.

11. The invention of claim 10 wherein said input terminal is coupled to said output terminal by a capacitor C connected in series with a resistor R3.

12. An amplifier comprising:
a first transistor Q1 having first and second output terminals and an input terminal adapted to receive an input signal;
a second transistor Q2 having first and second output terminals and an input terminal adapted to receive a signal from said first output terminal of Q1, wherein said second output terminal of Q1 is connected to said second output terminal of Q2; and
a circuit for holding said second output terminals of Q1 and Q2 at a desired voltage,
wherein said amplifier further includes a constant current source coupled to said first output terminal of Q1.

13. The invention of claim 12 wherein said circuit includes a Darlington pair comprised of a transistor Q3 having an input terminal and first and second output terminals, and a transistor Q4 having an input terminal and first and second output terminals.

14. The invention of claim 13 wherein said first output terminal of Q3 is connected to the input terminal of Q4.

15. The invention of claim 14 wherein said second output terminal of Q3 is connected to the second output terminal of Q4.

16. The invention of claim 15 wherein said first output terminal of Q4 is connected to the second output terminal of Q2.

17. An amplifier comprising:
a first transistor Q1 having first and second output terminals and an input terminal adapted to receive an input signal;
a second transistor Q1 having first and second output terminals and an input terminal adapted to receive a signal from said first output terminal of Q1, wherein said second output terminal of Q1 is connected to said second Output terminal of Q2; and
a circuit for holding said second output terminals of Q1 and Q2 at a desired voltage,
wherein said circuit includes a Darlington pair comprised of a transistor Q3 having an input terminal and first and second output terminals, and a transistor Q4 having an input terminal and first and second output terminals,
wherein said first output terminal of Q3 is connected to the input terminal of Q4,
wherein said second output terminal of Q3 is connected to the second output terminal of Q4,
wherein said first output terminal of Q4 is connected to the second output terminal of Q2, and
wherein said input terminal of Q3 is connected to a reference voltage VREF.

18. The invention of claim 17 wherein said circuit further includes a current source coupled to said first output terminal of Q3.

19. The invention of claim 12 wherein said amplifier further includes a resistor R1 connected between said first output terminal of Q2 and ground.

20. The invention of claim 12 wherein said amplifier further includes a resistor R2 connected between said second output terminal of Q4 and a supply voltage VCC.

21. The invention of claim 12 wherein said amplifier further includes an operational amplifier adapted to receive an input signal and output a signal to said input terminal of Q1.

22. The invention of claim 21 wherein said first output terminal of Q2 is coupled to a negative input terminal of said operational amplifier.

23. The invention of claim 22 wherein said input signal is applied to a positive input terminal of said operational amplifier.

24. The invention of claim 23 wherein said amplifier further includes an input terminal for receiving an input signal connected to said positive input terminal of said operational amplifier.

25. The invention of claim 24 wherein said amplifier further includes an output terminal coupled to said second output terminal of Q2.

26. The invention of claim 25 wherein said input terminal is coupled to said output terminal by a capacitor C connected in series with a resistor R3.

27. An amplifier comprising:
an input terminal adapted to receive an input signal;
a first Darlington pair comprised of two transistors Q1 and Q2, wherein a first output of Q1 is connected to an input of Q2 and a second output of Q1 is connected to a second output of Q2;
a cascode Darlington pair comprised of two transistors Q3 and Q4, wherein a first output of Q3 is connected to an input of Q4, a second output of Q3 is connected to a second output of Q4, and a first output of Q4 is connected to said second output of Q2;
an operational amplifier having a positive input connected to said input terminal, a negative input connected to a first output of Q2, and an output connected to an input of Q1;
an output terminal connected to said second output of Q4;
and a capacitor C and resistor R3 connected in series between said input terminal and said output terminal.

28. A method for reducing distortion in an amplifier including the steps of:
connecting two transistors Q1 and Q2 in a Darlington pair configuration wherein an input of Q1 is adapted to receive an input signal, and a first output of Q1 is connected to an input of Q2;
coupling a constant current source to said first output of Q1; and
connecting a second output of Q1 to a second output of Q2 to eliminate a nonlinear current component in Q2.

29. The invention of claim 28 wherein said method further includes holding said second output terminals of Q1 and Q2 at a desired voltage using a second Darlington pair Q3 and Q4 wherein a first output of Q3 is connected to an input of Q4, and a first output of Q4 is connected to said second output of Q2.

30. The invention of claim 29 wherein said method further includes connecting a second output of Q3 to a second output of Q4 to eliminate a nonlinear current component in Q4.

31. The invention of claim 28 wherein said method further includes adding a first feedback loop using an operational amplifier to minimize the amplifier's overall distortion products.

32. The invention of claim 28 wherein said method further includes adding a second feedback loop to set the input impedance and output impedance of the amplifier.

* * * * *

UNITED STATES PATENT AND TRADEMARK OFFICE
CERTIFICATE OF CORRECTION

PATENT NO. : 7,253,689 B2  Page 1 of 1
APPLICATION NO. : 11/148683
DATED : August 7, 2007
INVENTOR(S) : Don C. Devendorf et al.

It is certified that error appears in the above-identified patent and that said Letters Patent is hereby corrected as shown below:

In the Claims

Column 7, line 38, claim 17  Delete "Q1"
  Insert --Q2--

Column 7, line 42, claim 17  Delete "Output"
  Insert --output--

Signed and Sealed this

Twenty Second Day of April, 2008

JON W. DUDAS
*Director of the United States Patent and Trademark Office*